United States Patent
Saito et al.

(10) Patent No.: US 9,535,324 B2
(45) Date of Patent: Jan. 3, 2017

(54) HEAT-SENSITIVE RECORDING MEDIUM, AND COATING LIQUID FOR FORMING HEAT-SENSITIVE COLOR-DEVELOPING LAYER

(71) Applicant: THE NIPPON SYNTHETIC CHEMICAL INDUSTRY CO., LTD., Osaka (JP)

(72) Inventors: Masahiro Saito, Osaka (JP); Mayuka Kuroda, Osaka (JP)

(73) Assignee: THE NIPPON SYNTHETIC CHEMICAL INDUSTRY CO., LTD., Osaka (JP)

( * ) Notice: Subject to any disclaimer, the term of this patent is extended or adjusted under 35 U.S.C. 154(b) by 0 days.

(21) Appl. No.: 14/428,684

(22) PCT Filed: Nov. 5, 2013

(86) PCT No.: PCT/JP2013/079812
§ 371 (c)(1),
(2) Date: Mar. 17, 2015

(87) PCT Pub. No.: WO2014/077145
PCT Pub. Date: May 22, 2014

(65) Prior Publication Data
US 2015/0212409 A1    Jul. 30, 2015

(30) Foreign Application Priority Data

Nov. 19, 2012 (JP) .................................. 2012-253419
Dec. 21, 2012 (JP) .................................. 2012-279449

(51) Int. Cl.
*B41M 5/337* (2006.01)
*G03F 7/038* (2006.01)

(52) U.S. Cl.
CPC ............ *G03F 7/038* (2013.01); *B41M 5/3372* (2013.01); *B41M 2205/04* (2013.01)

(58) Field of Classification Search
CPC .. B41M 5/337; B41M 5/3372; B41M 2205/04
USPC ................................................. 503/209, 216
See application file for complete search history.

(56) References Cited

U.S. PATENT DOCUMENTS 6,730,632 B2 * 5/2004 Watanabe ............ B41M 5/3372
503/200
2003/0224935 A1    12/2003 Watanabe et al.

FOREIGN PATENT DOCUMENTS

| JP | 58-102794 | 6/1983 |
| JP | 2003-341246 | 12/2003 |
| JP | 2010-023252 | 2/2010 |
| JP | 2011-189525 | 9/2011 |

OTHER PUBLICATIONS

International Search Report from Japan for PCT/JP2013/079812, mailed Jan. 28, 2014.
Translation of the International Preliminary Report on Patentability for PCT/JP2013/079812, mailed May 28, 2015.
European Search Report issued with respect to application No. 13854325.1, mail date is May 23, 2016.

* cited by examiner

*Primary Examiner* — Bruce H Hess
(74) *Attorney, Agent, or Firm* — Greenblum & Bernstein, P.L.C.

(57) ABSTRACT

A heat-sensitive color-developing layer of a heat-sensitive recording medium and a coating liquid for forming the heat-sensitive color-developing layer each contain a leuco dye, a color developing agent and a polyvinyl alcohol resin containing an acetoacetyl group and a sulfonic acid group or a combination of a polyvinyl alcohol resin containing an acetoacetyl group and a polyvinyl alcohol resin containing a sulfonic acid group. Therefore, the heat-sensitive recording medium and the coating liquid for forming the heat-sensitive color-developing layer are excellent in light resistance, and free from unintended color development and discoloration even when exposed to ultraviolet radiation.

10 Claims, No Drawings

HEAT-SENSITIVE RECORDING MEDIUM, AND COATING LIQUID FOR FORMING HEAT-SENSITIVE COLOR-DEVELOPING LAYER

TECHNICAL FIELD

The present invention relates to a heat-sensitive recording medium having a heat-sensitive color-developing layer provided on a support base and containing a leuco dye and a color developing agent, and to a coating liquid for forming the heat-sensitive color-developing layer.

BACKGROUND ART

Heat-sensitive recording media have a heat-sensitive color-developing layer formed on a support base, for example, by applying an aqueous dispersion containing a leuco dye, a color developing agent and a dispersant on the support base and drying the applied aqueous dispersion. When such a heat-sensitive recording medium is heated, the leuco dye and the color-developing agent are melted and mixed together to react with each other, whereby the heat-sensitive color-developing layer develops a color. There has been developed a heat-sensitive recording medium which employs a polyvinyl alcohol (hereinafter abbreviated as PVA) containing a sulfonic acid group (modified with sulfonic acid) as the dispersant for dispersing the leuco dye and the color-developing agent (see PLT1).

The heat-sensitive recording media are relatively inexpensive, and permit easy maintenance of a recording device. Therefore, the heat-sensitive recording media are used as various recording media such as facsimile paper sheets, POS labels and various tickets. In recent years, the heat-sensitive recording media are often used outdoor and, therefore, exposed to sunlight more often.

When the heat-sensitive recording media are exposed to ultraviolet radiation, however, the chemical structures of the color developing agent, the leuco dye, a sensitizer and the like are changed to develop the color. Problematically, this results in so-called background fogging.

In order to solve the problem associated with light, a technique for providing an intermediate layer containing an aqueous UV-absorbing polymer between the heat-sensitive recording layer (heat-sensitive color-developing layer) and a protection layer has been proposed (see PLT2).

However, a heat-sensitive recording medium according to this technique is insufficient in light resistance. This is supposedly because the leuco dye and the like to be influenced by the light and the UV absorbing agent are contained in different layers, which are spaced from each other.

It is undesirable that the heat-sensitive recording layer (heat-sensitive color-developing layer) contains an organic compound such as the UV absorbing agent. This is because the leuco dye and the color developing agent are liable to be dissolved in the organic compound to react with each other to develop the color, resulting in the background fogging.

RELATED ART DOCUMENT

Patent Document

PLT1: JP-A-SHO58(1983)-102794
PLT2: JP-A-2010-23252

SUMMARY OF INVENTION

In view of the foregoing, it is an object of the present invention to provide a heat-sensitive recording medium which is excellent in light resistance and free from unintended color development and discoloration even if being exposed to ultraviolet radiation, and to provide a coating liquid for forming a heat-sensitive color-developing layer.

The inventor of the present invention conducted intensive studies in view of the foregoing. As a result, the inventor found that a heat-sensitive color-developing layer containing a leuco dye, a color developing agent, and a PVA resin containing an acetoacetyl group and a sulfonic acid group or a combination of a PVA resin containing an acetoacetyl group and a PVA resin containing a sulfonic acid group is excellent in UV absorbing property, and attained the present invention.

The present invention relates to a heat-sensitive recording medium including a heat-sensitive color-developing layer provided on a support base and containing a leuco dye and a color-developing agent, wherein the heat-sensitive color-developing layer further contains a PVA resin containing an acetoacetyl group and a sulfonic acid group.

The present invention further relates to a heat-sensitive recording medium including a heat-sensitive color-developing layer provided on a support base and containing a leuco dye and a color-developing agent, wherein the heat-sensitive color-developing layer further contains a polyvinyl alcohol resin containing an acetoacetyl group and a polyvinyl alcohol resin containing a sulfonic acid group.

The present invention further relates to a coating liquid for forming a heat-sensitive color-developing layer, the coating liquid containing a leuco dye, a color-developing agent, a PVA resin containing an acetoacetyl group and a sulfonic acid group, and water.

The present invention further relates to a coating liquid for forming a heat-sensitive color-developing layer, the coating liquid containing a leuco dye, a color-developing agent, a polyvinyl alcohol resin containing an acetoacetyl group, a polyvinyl alcohol resin containing a sulfonic acid group, and water.

In the present invention, the PVA resin has strong affinity for the leuco dye or the color-developing agent due to its sulfonic acid group and, therefore, functions as an excellent dispersant for dispersing the leuco dye and the color-developing agent in the coating liquid. It is supposed that the PVA resin and the acetoacetyl group contained in the PVA resin are locally present in the vicinity of the color developing agent, and the acetoacetyl group effectively prevents the structural change occurring due to the ultraviolet radiation. Particularly, where the PVA resin has the acetoacetyl group and the sulfonic acid group in combination in each molecule, these functional groups properly function substantially without inhibitive interaction therebetween, thereby improving the aforementioned properties.

The heat-sensitive color-developing layer of the inventive heat-sensitive recording medium contains the specific PVA resin, which ensures excellent dispersibility of the leuco dye and the color developing agent in the heat-sensitive color-developing layer and excellent UV absorbing property of the heat-sensitive color-developing layer. Accordingly, the inventive heat-sensitive recording medium is excellent in heat-sensitive color-developing property, and resistance to ultraviolet radiation and the like. Therefore, the inventive heat-sensitive recording medium is useful in applications in which the recording medium is often exposed to ultraviolet radiation or has a longer storage period, for example, in applications for POS labels, receipt sheets, sheets for various tickets such as train tickets and plane tickets, and facsimile sheets. The inventive heat-sensitive recording medium obviates the need for providing a UV absorbing layer or blending a UV absorbing agent for improving the UV absorbing property, thereby prevent ing a corresponding cost increase.

DESCRIPTION OF EMBODIMENTS

A heat-sensitive recording medium and a coating liquid for forming a heat-sensitive color-developing layer according to the present invention will hereinafter be described in detail.

First, the inventive heat-sensitive color-developing layer forming coating liquid will be detailed, and then the heat-sensitive recording medium produced by using the inventive heat-sensitive color-developing layer forming coating liquid will be described.

The inventive heat-sensitive color-developing layer forming coating liquid contains a leuco dye, a color developing agent, water, and a PVA resin containing an acetoacetyl group and a sulfonic acid group or a combination of a PVA resin containing an acetoacetyl group and a PVA resin containing a sulfonic acid group. As required, the coating liquid may further contain a glyoxylic acid salt.

[Acetoacetyl Group- and/or Sulfonic Acid Group-Containing PVA Resin]

The acetoacetyl group- and/or sulfonic acid group-containing PVA resin to be used in the present invention has a vinyl alcohol unit (major structural unit) obtained by saponification of vinyl acetate, a vinyl acetate unit left unsaponified, a structural unit containing an acetoacetyl group, and/or a structural unit containing a sulfonic acid group. The structural unit containing the acetoacetyl group is represented, for example, by the following general formula (1):

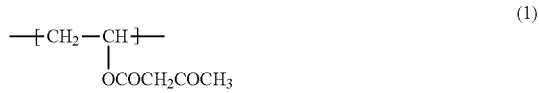

The PVA resin to be used in the present invention preferably has an acetoacetyl group content (i.e., modification degree) of 0.1 to 20 mol %, more preferably 0.5 to 15 mol %, particularly preferably 1 to 10 mol %. If the acetoacetyl group modification degree is excessively low, it will be impossible to ensure sufficient light resistance. If the modification degree is excessively high, the production will be difficult.

The PVA resin to be used in the present invention preferably has a sulfonic acid group content of 1 to 20 mol %, more preferably 1 to 10 mol %, particularly preferably 1 to 5 mol %. If the sulfonic acid group modification degree is excessively low, the effect of stabilizing particles of the color-developing agent is liable to be reduced. If the modification degree is excessively high, the production will be difficult.

The acetoacetyl group- and/or sulfonic acid group-containing PVA resin to be used in the present invention preferably has a 4 mass % aqueous solution viscosity (which is equivalent to the viscosity of the inventive heat-sensitive color-developing layer forming coating liquid) of 1.5 to 10 mPa·s, more preferably 2.0 to 6.0 mPa·s, particularly preferably 2.5 to 4.0 mPa·s, as measured at 20° C. in conformity with JIS K6726. The PVA resin typically has an average polymerization degree of 300 to 4000, particularly 400 to 3500, more preferably 500 to 3000 (as measured in conformity with JIS K6726). If the viscosity and the average polymerization degree are excessively low, the effect of stabilizing the color developing agent particles is liable to be reduced. If the viscosity and the average polymerization degree are excessively high, the dispersibility is liable to be reduced. The 4-mass % aqueous solution viscosity is widely used as an index of the molecular weight of the PVA resin.

The PVA resin typically has a saponification degree of 75 to 99 mol %, preferably 80 to 95 mol %, particularly preferably 85 to 90 mol %. If the saponification degree is excessively low, the solubility of the PVA resin in water is liable to be reduced. If the saponification degree is excessively high, the dispersibility of the color developing agent is liable to be reduced.

Exemplary methods for producing the acetoacetyl group- and sulfonic acid group-containing PVA resin to be used in the present invention include a method in which these functional groups are simultaneously introduced into a PVA resin by copolymerization, and a method in which a PVA resin containing one of these functional groups is prepared by copolymerization or the like and then the other functional group is introduced into the resulting PVA resin. A particularly preferred method is such that a PVA resin containing the sulfonic acid group is prepared by saponifying a copolymer of a sulfonic acid group-containing monomer and a vinyl ester monomer and then the acetoacetyl group is introduced into the resulting PVA resin by post modification.

The production method in which the sulfonic acid group-containing PVA resin is prepared by the copolymerization and then the acetoacetyl group is introduced into the resulting PVA resin by the post modification will hereinafter be described.

The sulfonic acid group-containing PVA resin is generally prepared by copolymerizing the vinyl ester monomer and the sulfonic acid group-containing monomer, and then saponifying the resulting copolymer.

Examples of the vinyl ester monomer include vinyl formate, vinyl acetate, vinyl propionate, vinyl valerate, vinyl butyrate, vinyl isobutyrate, vinyl pivalate, vinyl caprate, vinyl laurate, vinyl stearate, vinyl benzoate and vinyl versatate, among which vinyl acetate is preferred from an economic viewpoint.

Examples of the sulfonic acid group-containing monomer include: (I) an olefin sulfonic acid represented by the following general formula (2); (II) sulfoalkyl maleates represented by the following general formulae (3) and (4); (III) sulfoalkyl(meth)acrylamides represented by the following general formulae (5), (6) and (7); and (IV) a sulfoalkyl (meth)acrylate represented by the following general formula (8).

wherein R represents a C1 to C4 alkylene group, and M represents a hydrogen atom, an alkali metal or an ammonium group.

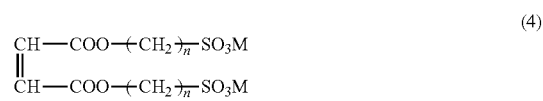

wherein $R_1$ represents a C1 to C3 alkyl group, n represents an integer of 2 to 4, and M represents a hydrogen atom, an alkali metal or an ammonium group.

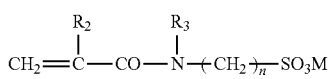

(5)

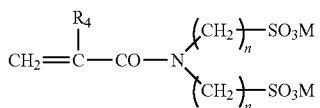

(6)

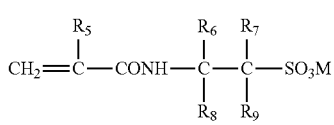

(7)

wherein $R_2$, $R_3$, $R_4$, $R_6$, $R_7$, $R_8$ and $R_9$ each represent a hydrogen atom, or a C1 to C3 alkyl group, $R_5$ represents a C1 to C3 alkyl group, n represents an integer of 2 to 4, and M represents a hydrogen atom, an alkali metal or an ammonium group.

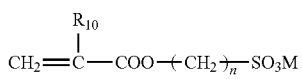

(8)

wherein $R_{10}$ represents a hydrogen atom or a C1 to C3 alkyl group, n represents an integer of 2 to 4, and M represents a hydrogen atom, an alkali metal or an ammonium group.

Specific examples of the olefin sulfonic acid include olefin sulfonic acids such as vinylsulfonic acid, allylsulfonic acid and methallylsulfonic acid, or salts of these olefin sulfonic acids.

Specific examples of the sulfoalkyl maleates include sodium sulfopropyl-2-ethylhexyl maleate, sodium sulfopropyl tridecyl maleate and sodium sulfopropyl eicosyl maleate.

Specific examples of the sulfoalkyl(meth)acrylamides include sodium sulfomethylacrylamide, sodium sulfo-t-butylacrylamide, sodium sulfo-S-butylacrylamide, sodium sulfo-t-butylmethacrylamide.

A specific example of the sulfoalkyl (meth)acrylate is sodium sulfoethyl acrylate. Where the sulfonic acid group is introduced by the copolymerization, an olefin sulfonic acid or a salt of the olefin sulfonic acid is preferably used out of the sulfonic acid group-containing monomers described above.

In the present invention, about 0.1 to about 10 mol % of an additional monomer may be copolymerized with the aforementioned comonomers, as long as the object of the present invention is not impaired. Examples of the additional monomer include: α-olefins such as ethylene, propylene, isobutylene, α-octene, α-dodecene and α-octadecene; unsaturated acids such as acrylic acid, methacrylic acid, crotonic acid, maleic acid, maleic anhydride and itaconic acid, or salts or mono- or di-alkyl esters of these unsaturated acids; nitriles such as acrylonitrile and methacrylonitrile; amides such as diacetone acrylamide, acrylamide and methacrylamide; olefin sulfonic acids such as ethylene sulfonic acid, allylsulfonic acid and methallylsulfonic acid, or salts of these olefin sulfonic acids; alkyl vinyl ethers, dimethylallyl vinyl ketone, N-vinylpyrrolidone, vinyl chloride and vinylidene chloride; polyoxyalkylene (meth)allyl ethers such as polyoxyethylene (meth)allyl ether and polyoxypropylene (meth)allyl ether; polyoxyalkylene (meth)acrylates such as polyoxyethylene (meth)acrylate and polyoxypropylene (meth)acrylate; polyoxyalkylene (meth)acrylamides such as polyoxyethylene (meth) acrylamide and polyoxypropylene (meth)acrylamide; polyoxyethylene (1-(meth) acrylamide-1,1-dimethylpropyl) ester, polyoxyethylene vinyl ether, polyoxypropylene vinyl ether, polyoxyethylene allylamine, polyoxypropylene allylamine, polyoxyethylene vinylamine and polyoxypropylene vinylamine.

Other examples include cation-containing monomers such as N-acrylamide methyl trimethylammonium chloride, N-acrylamide ethyl trimethylammonium chloride, N-acrylamide propyl trimethylammonium chloride, 2-acryloxyethyl trimethylammonium chloride, 2-methacryloxyethyl trimethylammonium chloride, 2-hydroxy-3-methacryloyloxypropyl trimethylammonium chloride, allyl trimethylammonium chloride, methallyl trimethylammonium chloride, 3-butene trimethylammonium chloride, dimethyl diallylammonium chloride and diethyl diallylammonium chloride; acetoacetyl group-containing monomers; and 3,4-diacetoxy-1-butene, 1,4-diacetoxy-2-butene, ethylene carbonate, vinylethylene carbonate, glycerin monoallyl ether, isopropenyl acetate and 1-methoxyvinyl acetate.

Particularly, an α-olefin-vinyl alcohol copolymer prepared by using an α-olefin such as ethylene, propylene, isobutylene, α-octene, α-dodecene or α-octadecene as a comonomer is preferred for improvement of emulsifying capability and for stabilization of the viscosity of the aqueous solution. The α-olefin content is preferably 0.1 to 10 mol %.

The method for the copolymerization of the vinyl ester monomer and the sulfonic acid group-containing monomer is not particularly limited, but a known method such as bulk polymerization, solution polymerization, suspension polymerization or emulsion polymerization may be employed for the copolymerization. In general, the solution polymerization is employed.

The method for feeding the monomers for the copolymerization is not particularly limited, but a simultaneous feeding method, a separate feeding method, a sequential feeding method or the like may be employed.

Typical examples of a solvent to be used for the copolymerization include lower alcohols such as methanol, ethanol, isopropyl alcohol, n-propanol and butanol, and ketones such as acetone and methyl ethyl ketone, among which methanol is industrially preferred.

The amount of the solvent to be used may be properly selected according to the target polymerization degree of the copolymer in consideration of the chain transfer constant of the solvent. Where methanol is used as the solvent, for example, a solvent/monomer mass ratio (S/M) is selected from a range of 0.01 to 10, preferably about 0.05 to about 3.

A polymerization catalyst is used for the copolymerization. Examples of the polymerization catalyst include known radical polymerization catalysts such as azobisisobutyronitrile, acetyl peroxide, benzoyl peroxide and lauryl peroxide, and lower-temperature active radical polymerization catalysts such as azobisdimethylvaleronitrile and azobismethoxydimethylvaleronitrile. The amount of the polymerization catalyst to be used varies depending on the type of the catalyst and, therefore, cannot be generally determined. The amount of the polymerization catalyst is properly selected according to the polymerization speed. Where azobisisobutyronitrile or acetyl peroxide is used, for example, the polymerization catalyst is preferably used in an amount of 0.01 to 1.0 mol %, particularly preferably 0.02 to 0.5 mol %, based on the amount of the vinyl ester monomer.

The reaction temperature for the copolymerization reaction is properly determined in a range of about 30° C. to a boiling point, more specifically, 35° C. to 150° C., preferably 40° C. to 75° C., depending on the solvent to be used and the pressure.

The resulting copolymer is subsequently saponified. The copolymer prepared in the aforementioned manner is dissolved in an alcohol or a water-containing alcohol, and saponified with the use of an alkali catalyst or an acid catalyst.

Examples of the alcohol include methanol, ethanol, propanol and tert-butanol, among which ethanol is particularly preferred. The concentration of the copolymer in the alcohol is properly determined according to the viscosity of the reaction system, and typically selected from a range of 10 to 60 mass %. Examples of the catalyst to be used for the saponification include alkali catalysts including hydroxides and alcoholates of alkali metals such as sodium hydroxide, potassium hydroxide, sodium methylate, sodium ethylate, potassium methylate and lithium methylate, and acid catalysts such as sulfuric acid, hydrochloric acid, nitric acid, methasulfonic acid, zeolite and cation exchange resins.

The amount of the catalyst to be used for the saponification is properly selected according to the saponification method, the target saponification degree and the like. Where the alkali catalyst is used, the amount of the catalyst is typically 0.1 to 30 mmol, preferably 2 to 15 mmol, based on 1 mol of the total amount of the vinyl ester monomer and the compounds represented by the general formulae (2) to (8).

The reaction temperature for the saponification reaction is preferably 10° C. to 60° C., particularly preferably 20° C. to 50° C.

Next, the method for introducing the acetoacetyl group into the sulfonic acid group-containing PVA resin by the post reaction will be described.

For the introduction of the acetoacetyl group by the post reaction, a hydroxyl group of the PVA resin is converted into acetoacetate by reaction of the PVA resin with a diketene.

For the acetoacetylation, for example, the sulfonic acid group-containing PVA resin may be homogeneously dissolved in a solvent such as DMSO (dimethyl sulfoxide) for uniform reaction, or the diketene in a liquid or gas form may be allowed to non-uniformly react with a solid PVA resin. The latter non-uniform reaction is industrially preferred because the reaction product can be easily separated and rinsed.

The sulfonic acid group-containing PVA resin to be used for the non-uniform reaction is preferably in a particulate form, particularly, having a narrower particle diameter distribution in order to ensure uniform adsorption and absorption of the diketene and uniform reaction for improvement of the reaction rate. The sulfonic acid group-containing PVA resin preferably has a particle size of 7 mesh pass and 450 mesh on, more preferably 10 mesh pass and 450 mesh on, particularly preferably 10 mesh pass and 320 mesh on as measured with the use of JIS standard sieves.

The sulfonic acid group-containing PVA resin often contains a small amount of alcohols, esters and water in a production process, and these components are liable to react with the diketene to consume the diketene, thereby reducing the diketene reaction rate. Therefore, these components are desirably minimized by heating or pressure reduction before the reaction.

The method for the reaction of particles of the sulfonic acid group-containing PVA resin with the diketene may be such that the diketene in the gas or liquid form is allowed to react directly with the PVA resin, such that an organic acid is preliminarily adsorbed or absorbed by the PVA resin particles and then the diketene in the gas or liquid form is sprayed to react with the resulting PVA resin particles in an inert gas atmosphere, or such that a mixture of an organic acid and the liquid diketene is sprayed to react with the particles of the sulfonic acid group-containing PVA resin.

Particularly, the method involving the adsorption and absorption of the organic acid by the PVA resin is preferred, because the diketene quickly infiltrates into the PVA resin.

The most preferred example of the organic acid is acetic acid not by way of limitation, but propionic acid, butyric acid, isobutyric acid or the like may be arbitrarily used.

The amount of the organic acid is preferably such that the organic acid can be entirely adsorbed and absorbed by the particles of the sulfonic acid group-containing PVA resin, in other words, such that the organic acid is not present separately from the resin in the reaction system. The amount of the organic acid to be added should be determined in consideration of the modification amount or the crystallization degree of the PVA resin. More specifically, the amount of the organic acid to be allowed to coexist with the PVA resin is 0.1 to 80 parts by weight, preferably 0.5 to 50 parts by weight, particularly preferably 5 to 20 parts by weight, based on 100 parts by weight of the PVA resin. If the amount of the organic acid is excessively small, it will be difficult to provide the effect of allowing the organic acid to coexist with the PVA resin. If the organic acid is present in excess, on the other hand, a greater amount of a cleaning solvent is required for removal of the organic acid after the reaction, resulting in poor economy.

Uniform adsorption and absorption of the organic acid by the sulfonic acid group-containing PVA resin may be achieved by any proper method, for example, by spraying only the organic acid over the PVA resin, or by dissolving the organic acid in a proper solvent and spraying the resulting solution over the PVA resin.

Where the liquid diketene is sprayed over the particles of the sulfonic acid group-containing PVA resin for the uniform adsorption and absorption, the diketene is preferably allowed to react with the sulfonic acid group-containing PVA resin at a temperature of 10° C. to 120° C. in an inert gas atmosphere with heating while being stirred or kept in a fluid state for a predetermined period.

The diketene gas is allowed to react with the sulfonic acid group-containing PVA resin at a contact temperature of 20° C. to 250° C., preferably 40° C. to 200° C. The diketene gas is preferably kept in contact with the sulfonic acid group-containing PVA resin at a temperature and a diketene partial pressure at which the diketene is not liquefied, but there is no problem even if the gas is partly condensed into liquid droplets.

The contact period is determined according to the contact temperature. The contact period is longer for a lower temperature, and is shorter for a higher temperature. The contact period is properly selected from a range of 1 minute to 6 hours.

The diketene gas may be supplied as it is, or may be supplied in the form of a gas mixture of the diketene and an inert gas. The temperature may be increased after the gas is absorbed by the sulfonic acid group-containing PVA resin, but the gas is preferably brought into contact with the resin while the resin is heated or after the resin is heated.

Effective examples of a catalyst for the reaction include basic compounds such as sodium acetate, potassium acetate, primary amines, secondary amines and tertiary amines. The catalyst is used in an amount of 0.1 to 10 wt % based on the amount of the sulfonic acid group-containing PVA resin. The PVA resin generally contains sodium acetate as a byproduct after the production, and this sodium acetate may be used as the catalyst. An excessively great amount of the catalyst is not preferred, because a side reaction of the diketene is liable to occur.

An apparatus which can be heated and includes a stirrer is used as a reactor apparatus. Examples of the reactor apparatus include a kneader, a Henschel mixer, a ribbon blender and other various blenders, and a stirring/drying apparatus.

In the present invention, the combination of the acetoacetyl group-containing PVA resin and the sulfonic acid group-containing PVA resin may be used instead of the acetoacetyl group- and sulfonic acid group-containing PVA resin. That is, even if the PVA resins respectively having the functional groups described above are used in combination, the dispersibility improving effect and the UV absorbing property improving effect required in the present invention can be provided as in the case in which the PVA resin containing both the acetoacetyl group and the sulfonic acid group is used. The introduction of the acetoacetyl group or the sulfonic acid group into a PVA resin is achieved by the same method as in the aforementioned process for producing the PVA resin containing the both functional groups. Where the acetoacetyl group-containing PVA resin and the sulfonic acid group-containing PVA resin are used in combination, the sulfonic acid group-containing PVA resin is used in a proportion of 10 to 200 parts by weight, preferably 30 to 150 parts by weight, particularly preferably 50 to 100 parts by weight, based on 100 parts by weight of the acetoacetyl group-containing PVA resin in order to provide the dispersibility improving effect and the UV absorbing property improving effect required in the present invention.

In the present invention, the PVA resin containing the acetoacetyl group and the sulfonic acid group in combination in each molecule more efficiently provides the dispersibility improving effect and the UV absorbing property improving effect required in the present invention substantially without inhibitive interaction between these functional groups as compared with the case in which the PVA resins respectively having the functional groups are used in combination. However, the combinational use of the PVA resins respectively having the functional groups is more advantageous in terms of production costs.

[Leuco Dye]

Generally usable as the leuco dye to be contained in the inventive heat-sensitive color-developing layer forming coating liquid is a known colorless or pale-color water-insoluble electron-donating compound which reacts with the color developing agent (which is an electron-receiving compound when being heated) to develop color.

Specific examples of the leuco dye include: triarylmethane compounds such as 3,3-bis(p-dimethylaminophenyl)-6-dimethylaminophthalide (crystal violet lactone), 3-(p-dimethylaminophenyl)-3-(1,2-dimethylindol-3-yl)phthalide, 3-(p-dimethylaminophenyl)-3-(2-phenylindol-3-yl)phthalide and 3,3-bis(9-ethylcarbazol-3-yl)-5-dimethylaminophthalide; diphenylmethane compounds such as 4,4-bis-dimethylaminobenzhydrin benzyl ether and N-halophenyl leuco auramine; xanthene compounds such as Rhodamine B-anilinolactam, 3-diethylamino-7-benzylaminofluoran, 3-diethylamino-7-butylaminofluoran, 3-diethylamino-7-(chloroanilino)fluoran, 3-diethylamino-6-methyl-7-anilinofluoran, 3-piperidino-6-methyl-7-anilinofluoran, 3-ethyltolylamino-6-methyl-7-anilinofluoran, 3-cyclohexylmethylamino-6-methyl-7-anilinofluoran, 3-diethylamino-6-chloro-7-(β-ethoxyethyl)aminofluoran, 3-diethylamino-6-chloro-7-(γ-chloropropyl)aminofluoran, 3-(N-ethyl-N-isoamyl)-6-methyl-7-phenylaminofluoran and 3-dibutylamino-6-methyl-7-anilinofluoran; thiazine compounds such as benzoyl leuco methylene blue, and p-nitrobenzoyl leuco methylene blue; spiro compounds such as 3-methyl-spiro-dinaphthopyran, 3-ethyl-spiro-dinaphthopyran, 3-benzylspiro-dinaphthopyran and 3-methylnaphtho-(3-methoxy-benzo)-spiropyran, which may be used alone or in combination. The leuco dye is properly selected from these leuco dyes according to the use application of the heat-sensitive recording medium.

[Color Developing Agent]

The color developing agent to be contained in the inventive heat-sensitive color-developing layer forming coating liquid is a water-insoluble electron-receiving acidic substance which, when being heated, is melted together with the leuco dye and react with the leuco dye to develop color. Examples of the color developing agent include a phenol derivative and an aromatic carboxylic acid derivative. Examples of the phenol derivative include p-octylphenol, p-tert-butylphenol, p-phenylphenol, 1,1-bis(p-hydroxyphenyl)propane, 2,2-bis(p-hydroxyphenyl)propane, 1,1-bis(p-hydroxyphenyl)pentane, 1,1-bis(p-hydroxyphenyl)hexane, 2,2-bis(p-hydroxyphenyl)hexane, 1,1-bis(p-hydroxyphenyl)-2-ethylhexane, 2,2-bis(4-hydroxy-3,5-dichlorophenyl)propane, butyl-2,2-bis(4-hydroxyphenyl) acetate and dihydroxydiphenyl ether. Examples of the aromatic carboxylic acid derivative include p-hydroxybenzoic acid, ethyl p-hydroxybenzoate, butyl p-hydroxybenzoate, 3,5-di-tert-butylsalicylic acid and 3,5-di-α-methylbenzylsalicylic acid, and polyvalent metal salts of aromatic carboxylic acids. Exemplary commercially-available color developing agents include α-{4-[(hydroxyphenyl)sulfonyl]phenyl}-ω-hydroxypoly (oxyethyleneoxy-p-phenylene) (trade name: D-90) and 4-(4-isopropoxyphenylsulfonyl)phenol (trade name: D-8) available from Nippon Soda Co., Ltd., and 4,4'-dihydroxydiphenyl sulfone (trade name: BPS-P(T)) available from Nikka Chemical Industry Co., Ltd.)

[Glyoxylic Acid Salt]

The glyoxylic acid salt to be contained as an optional component in the inventive heat-sensitive color-developing layer forming coating liquid functions as a crosslinking agent for the acetoacetyl group-containing PVA resin. It is preferred to crosslink the PVA resin by the glyoxylic acid salt, because the resulting crosslinked structure prevents the structural change of the color developing agent and the like due to UV radiation and improves the water resistance.

Examples of the glyoxylic acid salt include metal salts and amine salts of glyoxylic acid. Examples of the metal salts include salts of glyoxylic acid and metals such as alkali metals such as lithium, sodium and potassium, alkali earth metals such as magnesium and calcium, transition metals such as titanium, zirconium, chromium, manganese, iron, cobalt, nickel and copper, zinc and aluminum. Examples of the amine salts include salts of glyoxylic acid and amines such as monomethylamine, dimethylamine and trimethylamine, or ammonia.

In particular, the metal salts, particularly the salts of the alkali metals and the alkali earth metals are preferably used in order to provide a crosslinked polymer having excellent water resistance.

The proportion of the glyoxylic acid salt is typically 0.005 to 30 parts by weight, preferably 0.01 to 20 parts by weight, particularly preferably 0.05 to 15 parts by weight, based on 100 parts by weight of the acetoacetyl group-containing PVA resin. If the proportion of the glyoxylic acid salt is excessively great, the water resistance is liable to be reduced. If the proportion is excessively small, it will be impossible to sufficiently provide the effects of the present invention.

The reactive group of the glyoxylic acid salt is typically present in a proportion of 0.05 to 2 moles, preferably 0.5 to 1.5 moles, particularly preferably 0.1 to 1 mole, based on 1 mole of the acetoacetyl group of the PVA resin according to the present invention. If the proportion of the reactive group is excessively great, the water resistance is liable to be reduced. If the proportion is excessively small, it will be impossible to sufficiently provide the effects of the present invention.

Known methods may be used for the production of the glyoxylic acid salt. Exemplary methods include: (1) a method utilizing a neutralization reaction of glyoxylic acid; (2) a method utilizing a salt exchange reaction between glyoxylic acid and an acid having a greater acid dissociation constant than glyoxylic acid; (3) a method utilizing hydrolysis of a glyoxylic ester with an alkali (see, for example, JP-A-2003-300926); and the like. Particularly, where an alkaline compound to be used for the neutralization reaction of glyoxylic acid is highly water-soluble, the method (1) is preferably used. Where the resulting glyoxylic acid salt is less water-soluble and the acid having a greater acid dissociation constant than glyoxylic acid is highly water-soluble, the method (2) is preferably used.

In the method (1), water is generally used as the solvent. For the production of the glyoxylic acid salt, glyoxylic acid and the alkaline compound (e.g., any of the metal hydroxides and the amine compounds) are allowed to react with each other in water, and a precipitated glyoxylic acid salt is filtered and dried.

In the method (2), the glyoxylic acid salt can be obtained in the same manner as in the method (1) by allowing the reaction to proceed in water. Examples of the salt having a greater dissociation constant than glyoxylic acid for use in the method (2) include alkali metal salts and alkali earth metal salts of aliphatic carboxylic acids such as sodium acetate, calcium acetate and calcium propionate.

The glyoxylic acid salt synthesized through the reaction by the method (1) or (2) may be used in the reaction system as it is without separation of the glyoxylic acid salt after the synthesis of the glyoxylic acid salt. In this case, ingredients used for the production of the glyoxylic acid salt, impurities contained in the ingredients, byproducts of the production and the like are liable to be contained in the resulting product. For example, glyoxylic acid, a metal hydroxide, an amine compound, an aliphatic carboxylic acid salt, glyoxal, oxalic acid, an oxalic acid salt, glycolic acid, a glycolic acid salt and the like are often contained in the resulting product.

Particularly, where glyoxylic acid is used as an ingredient, glyoxal is liable to contained as the byproduct of the production. The glyoxal content is most desirably 0 wt %, but preferably not greater than 5 wt %, particularly preferably not greater than 2 wt %, more preferably not greater than 1 wt %. If the glyoxal content is greater, an aqueous solution obtained by mixing the resulting product with the PVA resin is liable to be less stable. This may result in a shorter pot life. Further, the resulting crosslinked polymer of the PVA resin is liable to be colored with time depending on storage conditions.

In the present invention, the glyoxylic acid salt may include a compound resulting from acetalation and hemiacetalation of its aldehyde group with an alcohol such as methanol or ethanol having not greater than three carbons, or a diol such as ethylene glycol or propylene glycol having not greater than three carbons. Dissociation of an alcohol from the resulting acetal group and hemiacetal group easily occurs in water or at a higher temperature. Therefore, the acetal group and the hemiacetal group establish equilibrium with the aldehyde group and, like the aldehyde group, react with monomers and functional groups, thereby functioning as a crosslinking agent.

[Production of Heat-Sensitive Color-Developing Layer Forming Coating Liquid]

The inventive heat-sensitive color-developing layer forming coating liquid is generally produced by separately preparing a dispersion containing the leuco dye and a dispersion containing the color developing agent, and then mixing these dispersions. For the preparation of the leuco dye-containing dispersion or the color developing agent-containing dispersion, the leuco dye or the color developing agent is dispersed with the use of the acetoacetyl group- and/or sulfonic acid group-containing PVA resin as a dispersant. The preparation of the leuco dye-containing dispersion and the color developing agent-containing dispersion is not limited to the method using the acetoacetyl group- and/or sulfonic acid group-containing PVA resin as the dispersant, but at least one of the leuco dye-containing dispersion and the color developing agent-containing dispersion may be prepared by using the acetoacetyl group- and/or sulfonic acid group-containing PVA resin. In this case, the acetoacetyl group- and/or sulfonic acid group-containing PVA resin is preferably used at least for the preparation of the color developing agent-containing dispersion.

The amount of the dispersant to be used is typically 1 to 40 parts by mass, particularly 1 to 10 parts by mass, preferably 1 to 5 parts by mass, based on 100 parts by mass of the leuco dye or 100 parts by mass of the color developing agent. If the dispersant is used in an excessively small amount, improper dispersion may result. If the dispersant is used in an excessively great amount, the coating liquid is liable to be foamed in a greater extent.

The leuco dye-containing dispersion and the color developing agent-containing dispersion may be prepared through a dispersing process by means of a known dispersing apparatus such as a sand grinder, an attritor, a bead mill, a ball mill, a sand mill, a viscosity mill, a tri-roll, an extruder, a kneader or a homogenizer. Dispersion particle diameters in the leuco dye-containing dispersion and the color developing agent-containing dispersion are not particularly limited, but are typically 0.1 to 10 µm, preferably 0.2 to 2 µm, more preferably 0.3 to 1 µm. If the dispersion particle diameters are excessively great, reduction in resolution and improper color development may result. If the dispersion particle diameters are excessively small, color development on background, reduction in image density, and improper color development may result.

The dispersion particle diameters may be properly controlled by dispersion conditions such as a dispersion period. Further, the pH of the leuco dye-containing dispersion and the pH of the color developing agent-containing dispersion are not particularly limited, but are typically 2 to 10, preferably 5 to 9, more preferably 6 to 8. An excessively low pH of the dispersion is not preferred, because gelation is liable to occur.

The solid content concentration of the coating liquid obtained after the leuco dye-containing dispersion and the color developing agent-containing dispersion are mixed together is not particularly limited, but is typically 20 to 70 mass %, preferably 30 to 60 mass %, more preferably 40 to 50 mass %. If the solid content concentration is excessively low, an unclear image is liable to be formed. If the solid content concentration is excessively high, improper coating may result.

The inventive heat-sensitive color-developing layer forming coating liquid may further contain an aqueous binder. Examples of the aqueous binder include: water-soluble polymers including starch and starch derivatives, cellulose derivatives such as hydroxymethylcellulose, hydroxyethylcellulose, carboxymethylcellulose, methylcellulose and ethylcellulose, polyvinyl alcohol, sodium polyacrylate, polyvinylpyrrolidone, acrylamide/acrylate copolymers, acrylamide/acrylate/methacrylic acid terpolymers, alkali salts of styrene/maleic anhydride copolymers, alkali salts of isobutylene/maleic anhydride copolymers, polyacrylamide, sodium alginate, gelatin and casein; emulsions of polyvinyl acetate, polyurethane, polyacrylic acid, polyacrylic esters, vinyl chloride/vinyl acetate copolymers, polybutyl methacrylate and ethylene/vinyl acetate copolymers; and latexes of styrene/butadiene copolymers and styrene/butadiene/acrylic copolymers. The amount of the aqueous binder to be added is not particularly limited, but is preferably 1 to 20 parts by mass based on 100 parts by mass of the total amount of the leuco dye and the color developing agent.

As required, the inventive heat-sensitive color-developing layer forming coating liquid may further contain the glyoxylic acid salt described above, and auxiliary additives such as a filler, a surfactant, a thermally soluble substance (or a lubricant), a pressure color-development preventing agent and the like.

[Production of Heat-Sensitive Recording Medium]

The inventive heat-sensitive recording medium is produced by applying the inventive heat-sensitive color-developing layer forming coating liquid on a support base and drying the resulting coating film to form a heat-sensitive color-developing layer. The method for applying the heat-sensitive color-developing layer forming coating liquid is not particularly limited. Examples of the method include an air knife method, a plate method, a gravure method, a roll coater method, a spray method, a dip method, a bar coat method, an extrusion method, a curtain coat method, and other known methods. The thickness of the heat-sensitive color-developing layer is properly determined according to the use purpose. The thickness of the heat-sensitive color-developing layer is not particularly limited, but is typically 3 to 50 µm, preferably 6 to 30 µm, more preferably 10 to 15 µm.

The proportion of the acetoacetyl group- and/or sulfonic acid group-containing PVA resin in the heat-sensitive color-developing layer formed on the support base is typically 0.5 to 50 parts by mass, particularly 0.5 to 20 parts by mass, preferably 0.5 to 5 parts by mass, based on 100 parts by mass of the total amount of the leuco dye and the color developing agent. If the proportion of the acetoacetyl group- and/or sulfonic acid group-containing PVA resin in the heat-sensitive color-developing layer is excessively small, the particle stabilizing effect is liable to be reduced. If the proportion is excessively great, on the other hand, the improper dispersion may result.

The proportions of the leuco dye and the color developing agent in the heat-sensitive color-developing layer are not particularly limited, but are each preferably 10 to 50 mass %, particularly preferably 15 to 40 mass %, more preferably 20 to 30 mass %. If the proportion of the leuco dye or the color developing agent in the heat-sensitive color-developing layer is excessively small, the improper color development may result. If the proportion is excessively great, the improper dispersion may result.

The support base on which the heat-sensitive color-developing layer is to be formed is not particularly limited. Examples of the support base include a paper sheet, a synthetic fiber sheet and a synthetic resin film. Particularly, a high quality paper sheet, a recycled paper sheet, a synthetic paper sheet or a laminate sheet is preferably used.

The inventive heat-sensitive recording medium may further include a protection layer provided on the heat-sensitive color-developing layer for prevention of unintended color development which may otherwise occur when the leuco dye and the color developing agent are dissolved and mixed in a solvent, an oil or the like. The inventive heat-sensitive recording medium may further include an intermediate layer provided between the support base and the heat-sensitive color-developing layer for prevention of interlayer separation of the support base and the heat-sensitive color-developing layer. The protection layer and the intermediate layer may each contain the aqueous binder and the auxiliary additives to be used for the heat-sensitive color-developing layer forming coating liquid, and may each further contain the acetoacetyl group- and/or sulfonic acid group-containing PVA resin to be used in the present invention.

The inventive heat-sensitive recording medium may be used as a pressure-sensitive heat-sensitive recording label, wherein an adhesive layer and a release sheet are provided in this order on a back surface (a surface opposite from the heat-sensitive color-developing layer) of the support base, or may be used as a thermally-activated heat-sensitive recording label requiring no release sheet, wherein a thermally activated adhesive layer which is not adhesive at ordinary temperatures but becomes adhesive when being heated is provided on the back surface. Further, a magnetic recording layer may be provided on the back surface of the support base, between the support base and the heat-sensitive color-developing layer, or on a part of the heat-sensitive color-developing layer.

The shape of the inventive heat-sensitive recording medium is not particularly limited, but may be properly selected according to the use purpose. The inventive heat-sensitive recording medium is preferably provided in a label form, a sheet form or a roll form. The recording method using the inventive heat-sensitive recording medium is not particularly limited, but may be properly selected from a thermal pen method, a thermal head method, a laser heating method and the like according to the use purpose.

EXAMPLES

The present invention will hereinafter be described more specifically by way of examples thereof. It should be understood that the present invention be not limited to the following examples within the scope of the present invention. In the following description, "%" and "parts" are based on the mass, unless otherwise specified.

Example 1

Production of Acetoacetyl Group- and Sulfonic Acid Group-Containing PVA Resin

<Preparation of Sulfonic Acid Group-Containing PVA Resin>

First, 1000 parts of vinyl acetate, 422 parts of methanol and 62 parts of sodium allylsulfonate (3.7 mol % based on vinyl acetate) were fed into a reaction can provided with a reflux condenser, a dropping funnel and a stirrer, and then 0.072 mol % of azobisisobutyronitrile (based on the fed vinyl acetate) was fed into the reaction can. The resulting mixture was heated to an increased temperature in a nitrogen stream with stirring, and polymerization was allowed to proceed under reflux.

During the polymerization, 0.072 mol % of azobisisobutyronitrile (based on the fed vinyl acetate) was added to the reaction can four times. When the polymerization percentage of the vinyl acetate reached 96.4%, 0.1 part of m-dinitrobenzene was added to the reaction can to finish the polymerization. In turn, unreacted vinyl acetate monomer was removed from the reaction system by a methanol vapor supplying method. Thus, a methanol solution of a copolymer was provided.

Then, the solution of the copolymer was diluted to a concentration of 55% with methanol, and the resulting copolymer solution was fed into a kneader. While the copolymer solution was kept at a solution temperature of 35° C., a methanol solution of sodium hydroxide (having a sodium concentration of 2%) was added to the copolymer solution to a sodium hydroxide concentration of 8 mmol per 1 mol of a vinyl acetate structural unit in the copolymer for saponification. As the saponification proceeded, a saponification product was precipitated in a particulate form. Then, the saponification product was filtered, thoroughly rinsed with methanol, and dried in a hot air dryer. Thus, a sulfonic acid group-containing PVA resin (PVA resin (1)) was prepared.

The resulting PVA resin (1) had a saponification degree of 87.3 mol % as analyzed based on an alkali consumption required for the hydrolysis of the remaining vinyl acetate unit, and a 4% aqueous solution viscosity of 2.5 mPa·s as measured at 20° C. in conformity with JIS K6726. Further, the PVA resin (1) had a sulfonic acid group content (modification amount) of 3 mol % as determined through an NMR (nuclear magnetic resonance) analysis.

<Acetoacetylation>

First, 100 parts of the PVA resin (1) prepared in the aforementioned manner was fed into a kneader, and 10 parts of acetic acid was added to the kneader for swelling the PVA resin (1). Then, the resulting mixture was heated to 40° C. while being stirred at a rotation speed of 20 rpm. Thereafter, 26 parts of diketene was added dropwise to the mixture in 7 hours, and a reaction was allowed to proceed for 1 hour. After completion of the reaction, the reaction product was rinsed with 400 parts of methanol twice, and dried at 70° C. for 8 hours. Thus, an acetoacetyl group- and sulfonic acid group-containing PVA resin (PVA resin (2)) was prepared. The PVA resin (2) thus prepared had an acetoacetyl group content (modification amount) of 7.4 mol % as determined through an NMR analysis.

[Preparation of Color Developing Agent Dispersion]

A color developing agent of 2,2'-bis[4-(4-hydroxyphenylsulfonyl)phenoxy]diethyl ether (D-90 available from Nippon Soda Co., Ltd.), the PVA resin (2) and water were blended together in a color developing agent/PVA resin/water blending ratio of 100 parts/2.5 parts/397.5 parts. The color developing agent was preliminarily dispersed in the resulting mixture by means of a homogenizer, and then further dispersed for 90 minutes by means of a bead mill (available from IMEX Co., Ltd., and including 200 g of 0.5-mm diameter zirconia beads fed as media and rotated at a rotation speed of 2000 rpm). Thus, a color developing agent dispersion was prepared.

[Measurement of Particle Diameter of Color Developing Agent]

In order to check the dispersion degree of particles of the color developing agent in the dispersion prepared in the aforementioned manner, the volume-weighted Gaussian particle diameter (nm) of the color developing agent in the dispersion was determined by means of a submicron particle size distribution/zeta potential analyzer NICOMP available from Particle Sizing System Co., Ltd. The results are shown below in Table 1.

[Measurement of Viscosity of Dispersion]

The viscosity of the dispersion prepared in the aforementioned manner was measured by means of a Brookfield viscometer DV-III with the rotation speed of a lower viscosity rotor kept at 150 rpm. The results are shown below in Table 1.

[Measurement of UV Absorbance]

A 30% aqueous solution of the PVA resin (2) prepared in the aforementioned manner was applied onto a PET film by a 200-µm applicator. The resulting coating was kept at 70° C. for 5 minutes in a dryer, and then dried at 23° C. at 50% RH for 3 days. The UV absorbance of the coating layer thus obtained was measured by means of JASCO V-7200 (available from JASCO Corporation). The results are shown below in Table 1.

[Evaluation for Water Resistance]

A 30% aqueous solution of the PVA resin (2) prepared in the aforementioned manner was spread in a 10 cm×10 cm tray, and air-dried at 23° C. at 50% RH for 3 days, whereby a 100-µm thick film was formed. The film thus formed was heat-treated at 70° C. for 5 minutes in an oven. The resulting film was immersed in water at 23° C. for 24 hours. Then, the dry weight $X^1$ (g) of the film before the immersion in water and the dry weight $X^2$ (g) of the film after the immersion in water were determined, and an elution ratio (%) was calculated from the following expression. A film having a lower elution ratio was rated as having water resistance. The results are shown below in Table 1.

Elution ratio (%)=[($X^1$–$X^2$)/$X^1$]×100

Example 2

First, 8.8 parts of an acetoacetyl group-containing PVA resin having a saponification degree of 88.4 mol %, an acetoacetyl group content (modification amount) of 8.5 mol % and a 4% aqueous solution viscosity of 5.1 mPa·s was mixed with 10 parts of the sulfonic acid group-containing PVA resin prepared in Example 1 (PVA resin (1)), whereby a PVA resin mixture (3) was prepared.

Then, a color developing agent dispersion was prepared in substantially the same manner as in Example 1 by blending a color developing agent of 2,2'-bis[4-(4-hydroxyphenylsulfonyl)phenoxy]diethyl ether (D-90 available from Nippon Soda Co., Ltd.), the PVA resin mixture (3) and water in a color developing agent/PVA resin mixture (3)/water blending ratio of 100 parts/5 parts/397.5 parts, and evaluated in the same manner as in Example 1. The results are shown below in Table 1.

Example 3

A dispersion was prepared by further adding 4.5 parts of a 10% aqueous solution of sodium glyoxylate to 100 parts of a 30% aqueous solution of the PVA resin (2) of Example 1. Then, the measurement of the UV absorbance and the evaluation for the water resistance were performed in the same manner as in Example 1. The results are shown below in Table 1.

Example 4

A dispersion was prepared by further adding 18 parts of a 10% aqueous solution of sodium glyoxylate to 100 parts of a 30% aqueous solution of the PVA resin (2) of Example 1. Then, the measurement of the UV absorbance and the evaluation for the water resistance were performed in the same manner as in Example 1. The results are shown below in Table 1.

Comparative Example 1

A color developing agent dispersion was prepared in substantially the same manner as in Example 1, except that only the sulfonic acid group-containing PVA resin (PVA resin (1)) was used instead of the acetoacetyl group- and sulfonic acid group-containing PVA resin (PVA resin (2)). The dispersion was evaluated in the same manner as in Example 1. The results are shown below in Table 1.

TABLE 1

|  | Example 1 | Example 2 | Example 3 | Example 4 | Comparative Example 1 |
|---|---|---|---|---|---|
| PVA resin | | | | | |
| Mixing type | Single molecule | Mixture | Single molecule | Single molecule | Single molecule |
| Sulfonic acid group content (mol %) | 3 | 3 | 3 | 3 | 3 |
| Acetoacetyl group content (mol %) | 7.4 | 8.5 | 7.4 | 7.4 | — |
| Proportion of Na glyoxylate (parts/100 parts of PVA) | — | — | 1.5 | 6 | — |
| Properties of color developing agent dispersion | | | | | |
| Particle diameter (nm) of color developing agent | 745 | 643 | — | — | 627 |
| Viscosity of dispersion (mPa · s) | 2.6 | 3.3 | — | — | 2.6 |
| Properties of coating film | | | | | |
| UV absorbance (Abs. at 250 nm) | 2.07 | 1.16 | 2.51 | 2.69 | 0.10 |
| Elution ratio (%) | 100 | 100 | 77 | 21 | 100 |

The results shown in the above table indicate that the dispersions of Examples 1 and 2, which each had a color developing agent particle diameter and a dispersion viscosity comparable to those of Comparative Example 1, each had color developing agent dispersibility comparable to that of Comparative Example 1, and were extremely excellent in UV absorbing property. Examples 3 and 4 in which sodium glyoxylate was blended were particularly excellent in UV absorbing property, and excellent in water resistance.

In the dispersion of Comparative Example 1 in which only the sulfonic acid group-containing PVA resin was used as the PVA resin, in contrast, the PVA resin properly functioned as the dispersant for the color developing agent. Therefore, the color developing agent had a smaller particle diameter, and the dispersion had a lower viscosity. However, the UV absorbance was very small.

While specific embodiment of the present invention have been shown in the aforementioned inventive examples, the inventive examples are merely illustrative of the invention but not limitative of the invention. It is contemplated that various modifications apparent to those skilled in the art could be made within the scope of the invention.

The inventive heat-sensitive recording medium is effectively applied to applications in which the medium is often exposed to ultraviolet radiation or has a longer storage period, because the specific PVA resin present in the heat-sensitive color-developing layer ensures excellent dispersibility of the leuco dye and the color developing agent and excellent UV absorbing property. The heat-sensitive recording medium is useful, for example, in applications for POS labels, receipt sheets, sheets for various tickets such as train tickets and plane tickets, and facsimile sheets.

The invention claimed is:

1. A heat-sensitive recording medium comprising:
   a support base; and
   a heat-sensitive color-developing layer provided on the support base;
   wherein the heat-sensitive color-developing layer comprises a leuco dye, a color-developing agent, and a polyvinyl alcohol resin containing an acetoacetyl group and a sulfonic acid group.

2. The heat-sensitive recording medium according to claim 1, wherein the acetoacetyl group- and sulfonic acid group-containing polyvinyl alcohol resin has an acetoacetyl group content of 0.1 to 20 mol %, and a sulfonic acid group content of 1 to 20 mol %.

3. The heat-sensitive recording medium according to claim 1, wherein the acetoacetyl group-containing polyvinyl alcohol resin is crosslinked by a glyoxylic acid salt.

4. The heat-sensitive recording medium according to claim 3, wherein the glyoxylic acid salt is an alkali metal salt or an alkali earth metal salt of glyoxylic acid.

5. A heat-sensitive recording medium comprising:
   a support base; and
   a heat-sensitive color-developing layer provided on the support base;
   wherein the heat-sensitive color-developing layer comprises a leuco dye, a color-developing agent, a polyvinyl alcohol resin containing an acetoacetyl group, a polyvinyl alcohol resin containing a sulfonic acid group, and a glyoxylic acid salt.

6. The heat-sensitive recording medium according to claim 5, wherein the acetoacetyl group-containing polyvinyl alcohol resin has an acetoacetyl group content of 0.1 to 20 mol %, and the sulfonic acid group-containing polyvinyl alcohol resin has a sulfonic acid group content of 1 to 20 mol %.

7. The heat-sensitive recording medium according to claim 5, wherein the glyoxylic acid salt is an alkali metal salt or an alkali earth metal salt of glyoxylic acid.

8. A coating liquid for forming a heat-sensitive color-developing layer, the coating liquid comprising:
   a leuco dye,
   a color-developing agent,
   a polyvinyl alcohol resin containing an acetoacetyl group and a sulfonic acid group, and water.

9. The coating liquid for forming the heat-sensitive color-developing layer according to claim 8, the coating liquid further comprising a glyoxylic acid salt.

10. A coating liquid for forming a heat-sensitive color-developing layer, the coating liquid comprising:
    a leuco dye,
    a color-developing agent,
    a polyvinyl alcohol resin containing an acetoacetyl group,
    a polyvinyl alcohol resin containing a sulfonic acid group,
    a glyoxylic acid salt, and
    water.

* * * * *